United States Patent [19]

Gehle

[11] 4,184,133
[45] Jan. 15, 1980

[54] ASSEMBLY OF MICROWAVE INTEGRATED CIRCUITS HAVING A STRUCTURALLY CONTINUOUS GROUND PLANE

[75] Inventor: Richard W. Gehle, Yorba Linda, Calif.

[73] Assignee: Rockwell International Corporation, El Segundo, Calif.

[21] Appl. No.: 855,132

[22] Filed: Nov. 28, 1977

[51] Int. Cl.² ............................................. H01P 3/08
[52] U.S. Cl. ...................................... 333/238; 156/64; 156/298; 156/329; 264/261; 333/246
[58] Field of Search .................. 264/261; 156/64, 298, 156/329; 333/84 M

[56] References Cited
U.S. PATENT DOCUMENTS

| | | | |
|---|---|---|---|
| 3,840,828 | 10/1974 | Linn et al. | 333/84 M X |
| 3,843,764 | 10/1974 | Grawey et al. | 156/329 X |
| 3,982,271 | 9/1976 | Olivieri et al. | 333/84 M X |
| 4,070,224 | 1/1978 | Zemlin et al. | 156/329 X |

Primary Examiner—Paul L. Gensler

Attorney, Agent, or Firm—H. Fredrick Hamann; Gilbert H. Friedman

[57] ABSTRACT

One or more MIC's (microwave integrated circuits) are included in an assembly having a structurally continuous ground plane of conductive material for the microwave circuitry. Individual MIC's are mounted on a carrier and attached thereto by a layer of a dielectric adhesive. The adhesive is in contact with and interposed between the lower side of each MIC substrate and the carrier which may be, for example, a metal chassis. The carrier serves as, or includes, the structurally continuous ground plane of conductive material. Ground plane metallization on the lower side of MIC substrates is thereby made unnecessary. The dielectric adhesive may be maintained in a liquid or tacky state to permit convenient removal from the assembly of an MIC requiring rework or replacement. In addition, the layer of dielectric adhesive provides a thermally conductive path between an MIC and the carrier making the invention particularly well suited for MIC assemblies which are intended to be operated in a vacuum.

10 Claims, 2 Drawing Figures

ASSEMBLY OF MICROWAVE INTEGRATED CIRCUITS HAVING A STRUCTURALLY CONTINUOUS GROUND PLANE

The invention herein described was made in the course of or under a contract or subcontract thereunder, with the U.S. Air Force.

BACKGROUND OF THE INVENTION

1. Field of the Invention

The present invention relates generally to microwave integrated circuitry and more particularly pertains to MIC (microwave integrated circuit) assemblies having a continuous ground plane for one or more MIC's.

2. Description of the Prior Art

In the field of microwave integrated circuitry, it is the practice to employ substrates of a ceramic material on which are disposed active and passive microwave circuit elements and devices. The lower sides of substrates are metallized to provide a ground plane for the devices and the remaining portions of the circuit elements are disposed on the upper sides of the substrates.

Terms such as upper, lower, top, bottom, etc., are used herein for convenience of description only and imply no required or preferred orientation for the object described.

Individual MIC's are incorporated into an assembly by mounting one or more of them on a structure which serves as a support member or carrier for the MIC's. Interconnections are made between the MIC's. Interconnections are also made to external connectors which are typically coaxial connectors having their outer housings fastened to, and grounded to, the carrier.

Where the carrier is of sheet metal or metal plate, it is usually referred to as a chassis. A chassis is typically fabricated from a single piece of conductive metal and therefore exhibits good electrical and thermal conduction throughout. Such a single piece of conductive material is described herein as being capable of serving as a structurally continuous ground plane.

In the fabrication of prior art MIC assemblies, it has been regarded as essential to provide good conductive electrical contact between a primary ground plane and ground plane metallization on the lower side of each MIC substrate. The primary ground plane is typically a structurally continuous ground plane such as is provided by a chassis. Where ground plane metallizations on substrates are present and conductively connected to a primary ground plane provided by a carrier, such ground planes are referred to as discontinuous in this specification. Good electrical contact between a chassis and substrate metallization tends to assure that the performance of the MIC will conform to that which was intended by reason of its design or to that which was observed in tests of the MIC as an isolated unit or, ideally, both of these.

However, what suffices as good electrical contact may vary as the frequency of operation varies. Parasitic elements introduced into a circuit by reason of less than ideal grounding may have a negligible effect on circuit performance when the circuit is operating at, for example, 500 megahertz but may cause serious degradation of circuit performance at, for example, 10 gigahertz.

It will be apparent to those skilled in the art that good electrical contact between substrate metallization and a chassis surface cannot ordinarily be obtained by simply placing the metallized surface of the substrate on the chassis. Parts fabricated to reasonable specifications for most applications are neither optically flat nor highly polished. The percentage of substrate metallization in actual metal-to-metal contact with the chassis would tend to be small due to random curvatures in the parts and roughness or irregularities on their surfaces.

Several different techniques are used in the prior art to provide an improved connection between the ground plane metallization of an MIC substrate and a chassis. These include, for example, the use of mechanical fasteners such as screws, conductive adhesives such as the epoxies filled with powdered conductive metal, and reflowed solder.

Screws are sometimes used to apply pressure at the interface between the substrate metallization and the adjacent surface of the chassis. This increases the area of metal-to-metal contact but typically only in the neighborhood of a screw. Care must be exercised in using a mechanical fastener mounting technique such as this since excessive pressure will fracture the dielectric substrate which is typically of alumina or beryllia.

Screws have been used successfully for temporarily mounting MIC's in test fixtures for preliminary check-out. Test results have been found to be reasonably reproducible and in reasonable conformance to design expectations up to about eight gigahertz. However, difficulties have been encountered at higher frequencies. At these higher frequencies, screw-mounted MIC circuitry can exhibit substantial variation in its behavior from design expectations. Experience has shown that MIC performance is especially sensitive to the quality of the direct contact between the lower surface metallization and the chassis at certain places. One such place, for example, is at or near the edge of an MIC substrate directly beneath microstrip interconnections between the MIC and another MIC or a coaxial connector. A technique used in the laboratory to improve the electrical contact is to force pieces of gold ribbon between the substrates and chassis at these places.

The metal-filled epoxies can be used to good advantage to provide a strong attachment having both good thermal contact and good electrical contact between MIC ground plane metallization and a chassis. This is so because the epoxy, before curing, can be caused to fill the interstitial space between opposing surfaces thereby removing the effects of surface curvature and irregularities. However, the use of expoxy has a disadvantage in that, once cured, its attachment is typically permanent. If one individual MIC then fails, an entire assembly may have to be discarded. However, see U.S. patent application Ser. No. 821,034, filed Aug. 1, 1977, by the applicant herein and assigned to the assignee of this application; that application describes a releasable mounting for MIC's employing both mechanical fasteners and metal-filled epoxies.

In addition, the use of metal-filled epoxy adhesives for mounting MIC's in assemblies becomes seriously disadvantageous at frequencies higher than about one gigahertz because the electrical loss in the adhesive then becomes excessive.

Several problems have been encountered in the use of solder for attaching MIC's to a chassis. As one example, the choice of a flux is a compromise. The fluxes which are active enough to be effective are detrimental to microwave devices. Those fluxes which are benign to the devices produce wetting of the surfaces no better than about 20% to 30% in some observed processes. Thus, the presence of a good ground plane connection to the chassis directly beneath microstrip interconnections between MIC's and between an MIC and a coaxial connector center conductor, cannot be assured. As another example, solder often flows up between two closely-spaced MIC substrates during the reflow soldering process. If the upward reach of this solder is sufficient, short-circuiting of an upper surface element may occur while a lesser reach of solder may still cause detuning by introducing parasitic capacitances.

SUMMARY OF THE INVENTION

The general purpose of this invention is to provide an MIC assembly which performs satisfactorily while avoiding the above-described disadvantages. To attain this, the present invention provides a unique arrangement wherein an MIC substrate is mounted to a carrier or chassis by a layer of a dielectric material interposed between the lower surface of the MIC substrate and the carrier. Preferably, the dielectric material is also an adhesive material. The carrier provides the requisite ground plane for the microwave integrated circuit components disposed on the substrate. The ground plane is preferably fabricated from a continuous piece of sheet or plate metal and is thus a structurally continuous ground plane. One or more MIC's so mounted on a carrier have been operated to produce performance reasonably conforming to design specifications without any conductive connection being made to secondary ground plane metallization on the lower surfaces of the MIC substrates. Ground plane metallization on the lower surface of the MIC substrate is thereby made unnecessary.

For the purposes of this specification, satisfactory performance for an MIC means performance reasonably close to that which is expected by reason of the intended design of the circuit. Alternatively stated, it means performance which is reasonably free of losses or degradation by reason of the introduction of parasitic circuit elements arising from variations in the actual grounding from ideal grounding.

Satisfactory MIC performance has been observed in assemblies using the subject invention over a range of frequencies. At frequencies up to about one gigahertz, performance has been at least generally equivalent to the prior art. At higher frequencies, 16 gigahertz, for example, the performance of MIC assemblies using the subject invention has been observed to be significantly more satisfactory than prior art MIC assemblies wherein the individual MIC substrates have been attached to chassis using mechanical fasteners, conductive epoxies, or solder.

Another advantage of the preferred embodiment of the subject invention lies in its use of a dielectric material which is also an adhesive in a manner which fills up the interstitial space between an MIC substrate and a carrier. There is thus provided a good thermal conduction path between the MIC and the carrier. This advantage over mechanical fasteners and solder is shared with the use of epoxies. The provision of such a thermal path is essential for applications of MIC circuitry in a vacuum such as for spaceborne communications.

The adhesive material is preferably one which can be maintained in a tacky state for an indefinite period of time while the MIC assembly is being tested. This permits ready removal of a defective MIC for rework or replacement. Subsequently, when tests indicate satisfactory assembly operation, the adhesive may be cured to a hardened state at a temperature below that which might cause damage to any circuit components.

BRIEF DESCRIPTION OF THE DRAWINGS

Like parts are assigned like reference numerals in the figures. The figures are not necessarily drawn to scale since the dimensions thereof have been chosen primarily for the sake of illustration.

DESCRIPTION OF THE PREFERRED EMBODIMENTS

Figure 1:
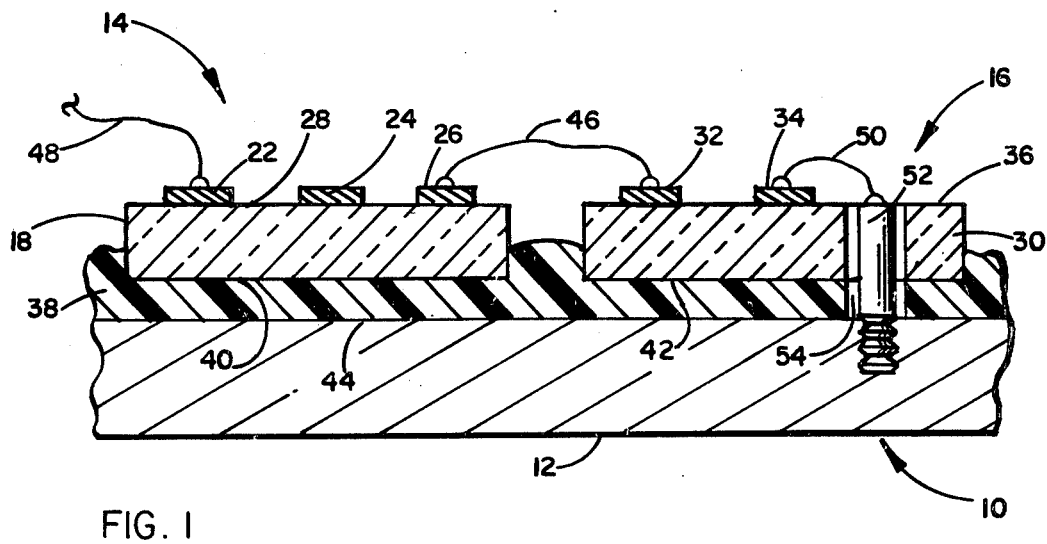
FIG. 1 is a schematic cross-sectional view of an MIC assembly in accordance with the subject invention.

FIG. 1 shows an MIC assembly 10 formed of a carrier 12 serving as a support member for at least two individually distinct MIC's 14 and 16. That there are two distinct MIC's, 14 and 16, shown in FIG. 1 is by way of example only. The subject invention may be practiced with as few as one or as many as a large plurality of individually distinct MIC's in a single MIC assembly.

As shown in FIG. 1, the carrier 12 is preferably formed from a single continuous piece of sheet metal or metal plate. High electrical conductivity is preferred so that the particular metal used is typically copper or aluminum. Aluminum is often preferred for its low cost and weight. To prevent the formation of oxide on the surfaces of the carrier 12 and thereby enhance the ability to make good conductive connection thereto, the carrier 12 is preferably plated with a less active metal such as gold, nickel, or the like (not shown).

For the purposes of this specification, any configuration of electrically conductive material, including an assembly of structurally distinct pieces of conductive material, will be termed and may be used to provide a structurally continuous ground plane provided certain alternative conditions are met. First, such a configuration is a structurally continuous ground plane for an MIC when the MIC performs satisfactorily with that ground plane even though the lower surface of the substrate for the MIC is substantially free of metallization. Second, such a configuration is a structurally continuous ground plane for an MIC when the MIC performs satisfactorily with that ground plane even though (ground plane) metallization on the lower surface of the substrate for the MIC remains conductively unconnected to the configuration. Third, such a configuration is a structurally continuous ground plane for an MIC when the MIC performs satisfactorily with that ground plane even though there is metallization on the lower surface of the substrate for the MIC and that metallization is held at ground potential, or any other fixed potential, by direct or indirect connection to the configuration provided that the metallization covers significantly less than all of that portion of the lower surface of an MIC substrate directly below MIC components disposed on the upper surface thereof.

MIC 14 comprises a substrate 18 and components 22, 24, and 26 for microwave circuitry disposed on the upper surface 28 of substrate 18. The substrate 18 is typically formed of a ceramic material having a relatively high dielectric constant such as, for example, alumina or beryllia. Components 22, 24 and 26 are indicated in FIG. 1 in general form only. Components 22 and 26 may be, for example, portions of microstrip, or stripline, transmission lines deposited on the substrate 18 while component 24 may be, for example, an active semiconductor device. Similarly, MIC 16 comprises a substrate 30 having components 32 and 34 for microwave integrated circuitry disposed on the upper surface 36 thereof. Component 32 may be, for example, a portion of a microstrip transmission line while component 34 may be, for example, another semiconductor device.

A layer 38 of dielectric material is shown in FIG. 1 interposed between and in contact with the carrier 12 and the lower surfaces 40 and 42 of substrates 18 and 30, respectively. The dielectric constant of the material of layer 38 may have any value characteristic of the particular material chosen for this purpose. However, for convenience and simplicity in designing the circuitry, it is preferred that the dielectric constant be substantially equal to the dielectric constant of the material of the substrates 18 and 30. For example, alumina has a dielectric constant of about 10. Where substrates 18 and 30 are of alumina then, it is preferred that the material of layer 38 have a dielectric constant substantially equal to 10 also.

Various means of attaching the substrates 18 and 30 to the carrier 12 consistent with this invention may occur to those skilled in the art. However, the dielectric material of layer 38 is also an adhesive material serving to attach the substrates 18 and 30 to the carrier 12 in the preferred embodiment of this invention. In addition, this adhesive material is preferably a curable material which is initially in a liquid state when it is applied. This is so that the adhesive material readily conforms to the curvatures and irregularities in the upper surface 44 of the carrier 12 and the lower surfaces 40 and 42 of substrates 18 and 30, respectively. A layer 38 which is thus conformed to the surfaces mentioned provides an efficient heat conducting member between MIC's 14 and 16 and the carrier 12. The provision of such a heat conducting member is particularly advantageous when the subject invention is to be used in an MIC assembly to be operated in a vacuum such as in communications equipment aboard spacecraft.

The dielectric material for the layer 38 may be any one of several well-known polymer resin casting materials having the preferred curable adhesive characteristics mentioned above and serving as a carrier for a filler of any combination of certain powdered minerals. The powdered minerals are used to adjust the dielectric constant of the mixture to a desired value as discussed above. The polymer resin casting material may be, for example, silicone, styrene, or epoxy. The minerals may be, for example, titanium oxide, silicon dioxide, aluminum oxide, calcium carbonate, or lithofrax (lithium aluminum silicate). The quantity of mineral mixed with the resin typically varies from about 20% to about 80% by weight of the mixture. Such filled casting materials are well known to those skilled in the art.

As yet another desired characteristic for the adhesive and dielectric material of the layer 38, this material is preferably one which initially is and can remain viscous and tacky indefinitely at room temperatures or one which can be partially cured to that condition. Maintaining the material in a tacky condition permits relatively easy and convenient removal, preferably using only a moderate amount of force, of any one MIC which is found to be defective during tests of the entire assembly. The force used to remove an MIC from an assembly may be regarded as moderate if it is not likely to cause damage to the MIC. Final curing of the material to a hardened state can be accomplished once the assembly is shown to be functioning satisfactorily. Curing should occur at a temperature below that which can cause damage to the circuitry.

A particular casting material which has been found to possess the preferred characteristics discussed above is the casting material sold under the trade name Custom High-K 707-10 Castable, a high temperature silicone base dielectric manufactured and sold by the Electronic Products Division of 3M Corporation, Chelmsford, Mass.

There is no metallization shown in FIG. 1 on the bottom surfaces 40 and 42 of the substrates 18 and 30. No metallization is required on these surfaces for satisfactory operation of the microwave circuitry since the carrier 12 provides the necessary ground plane. However, even if the bottom surfaces 40 and 42 were metallized, this would not interfere with satisfactory operation of the microwave circuitry since such metallization would be insulated from connection with other circuitry by substrates 18 and 30 and by layer 38 of dielectric material. If such metallization had an effect on the operation of the microwave circuitry, such effect could be accounted for readily in the original design of the circuitry.

A wire 46 for interconnecting MIC 14 to MIC 16 is shown bonded to component 26 of MIC 14 and to component 32 of MIC 16. A second wire 48 is shown connected to component 22 of MIC 14. Wire 48 may be used to interconnect the microwave circuitry of MIC 14 to yet another MIC (not shown) or, optionally, to a coaxial connector as will be discussed below in connection with FIG. 2.

A third wire 50 is shown in FIG. 1 interconnecting component 34 on the upper surface 36 of MIC 16 to a stud 52 descending through a hole 54 provided therefor in the substrate 30 and layer 38 of dielectric material to the carrier 12. The stud 52 is threaded into an in electric contact with the carrier 12. The stud 52 provides a means for readily connecting to ground those microwave components on the top surface 36 of MIC 16 which requires such connection. This would be the case, for example, if component 34 were an active semiconductor device employing grounded or common emitter circuitry.

Although FIG. 1 shows the stud 52 attached to the carrier 12 by threads, a pin force-fit onto the carrier 12 would serve equally well.

Figure 2:
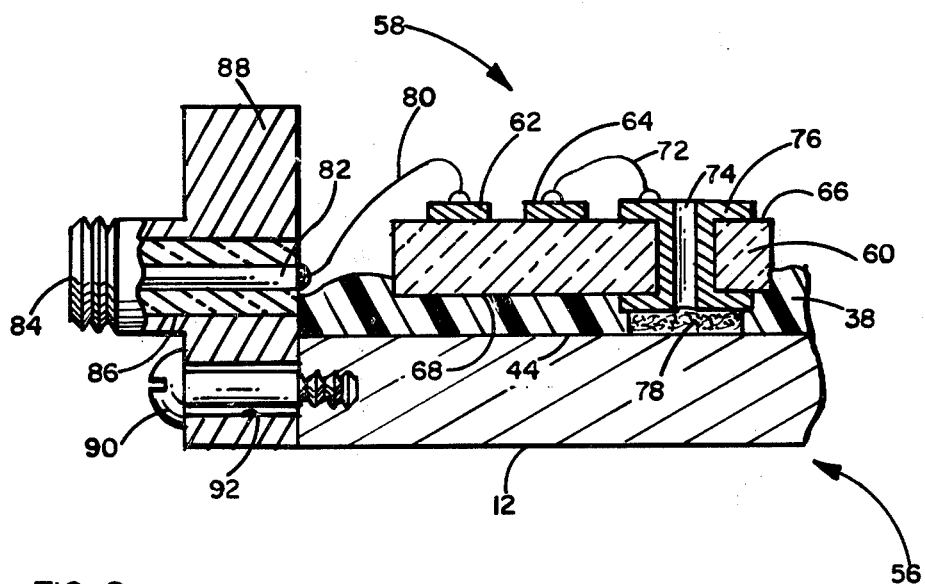
FIG. 2 is a schematic cross-sectional view of an MIC assembly in accordance with an alternative embodiment of the subject invention.

FIG. 2 shows an MIC assembly 56 formed of a carrier 12 serving as a support member for at least one individually distinct MIC 58. Carrier 12 also serves as a support member for a coaxial connector 84 having its outer housing 88 conductively connected to the carrier 12 by way of a screw 90 passing through a hole 92 in the housing 88. Since at least one of the MIC's in an MIC assembly is likely to require interconnection for input, output, or both of these, connectors such as coaxial connector 84 or their equivalent are typically an essential part of an MIC assembly. The inner or central conductor 82 of connector 84 is supported in a cylinder 86 of dielectric material fitted into housing 88. Central conductor 82 is connected by wire 80 to component 62 on the upper surface 66 of the substrate 60 of MIC 58. Component 62 may be, for example, a microstrip transmission line.

FIG. 2 illustrates an alternative embodiment of means for providing access to a source of a fixed potential, here ground potential, for components such as component 64 on the upper surface 66 of substrate 60. A through-hole 74 formed in substrate 66 is plated with a conductive metal to form a conductive spool or ring 76 covering the walls of the hole 74 and the area immediately adjacent hole 74 on upper surface 66 and lower surface 68 of substrate 60. Component 64 is conductively connected to spool 76 by wire 72. Component 64 may be an active semiconductor device requiring, for example, a connection to ground for common emitter transistor circuitry.

The spool 76 of metal plated in through-hole 74 is conductively coupled to the upper surface 44 of carrier 12 through a disk 78 of a metallic wool or felt compressed between the lower surface 68 of substrate 60 and the upper surface 44 of carrier 12. Thus, metallic wool disk 78 closes the circuit for holding wire 72 and appropriately connected portions of component 64 at ground potential.

The plating 76 in through-hole 74 in effect places metallization on the lower surface 68 of substrate 60. Nevertheless, this metallization is required to cover lower surface 68 only to a very limited extent to serve the purpose described immediately above. No metallization is required to appear directly beneath microwave components on the upper surface 66 of substrate 60 nor is it required near the edges of substrate 60. The plating 74 then need not introduce any undesired ground plane effects into the performance of MIC 58 provided correct design practices are followed.

There have been described preferred embodiments of the invention. However, it will be apparent to those skilled in the art that embodiments other than those which have been expressly described are possible and that these other embodiments will fall within the spirit and scope of this invention as set forth in the following claims.

What is claimed is:

1. A microwave integrated circuit assembly comprising:
   a substrate of a first dielectric material, said substrate having an upper surface and a lower surface;
   components for microwave integrated circuitry disposed on said upper surface of said substrate;
   carrier means for supporting said substrate, said carrier means including means for providing a structurally continuous ground plane for said microwave integrated circuitry;
   a layer of a second dielectric material interposed between said lower surface of said substrate and said carrier means, wherein said second dielectric material is an adhesive material attaching said substrate to said carrier means; and
   wherein said substrate lower surface and said ground plane are free of conductive electrical connection with each other.

2. A microwave integrated circuit assembly as recited in claim 1 wherein said layer of a second dielectric material conforms to contours and irregularities on said substrate lower surface and conforms to contours and irregularities on a surface portion of said carrier means opposing said substrate lower surface thereby providing a substantially continuous thermal conduction member thermally connecting said substrate to said carrier.

3. A microwave integrated circuit assembly as recited in claim 2 wherein said adhesive material means is curable to a desired degree of tackiness.

4. A microwave integrated circuit assembly as recited in claim 3 wherein a microwave integrated circuit assembly attached to said carrier by said adhesive material means is removable from said assembly by application of a moderate amount of force.

5. A microwave integrated circuit assembly as recited in claim 2 wherein said first dielectric material has a first dielectric constant, wherein said second dielectric material has a second dielectric constant and wherein said first dielectric constant and said second dielectric constant are substantially equal.

6. A microwave integrated circuit assembly as recited in claim 5 wherein said substrate lower surface is substantially free of metallization.

7. A microwave integrated circuit assembly as recited in claim 5 wherein said substrate lower surface has metallization thereon and wherein said metallization is insulated from conductive connection to other circuitry.

8. A microwave integrated circuit assembly as recited in claim 6 comprising means for conductively connecting said components for microwave integrated circuitry to said ground plane.

9. A microwave integrated circuit assembly as recited in claim 7 comprising means for conductively connecting said components for microwave integrated circuitry to said ground plane.

10. A microwave integrated circuit assembly, comprising:
    a plurality of substrates of a first dielectric material;
    components for microwave integrated circuitry disposed on the upper surfaces of said substrates;
    carrier means for supporting said substrates, said carrier means including means for providing a single structurally continuous ground plane for all of said components on said plurality of substrates;
    a layer of a second dielectric material interposed between the lower surfaces of said substrates and said carrier means wherein said second dielectric material is an adhesive material attaching said substrates to said carrier means; and
    wherein the lower surfaces of said substrates and said ground plane are free of conductive electrical connection between them.

* * * * *